United States Patent
Zhang

(10) Patent No.: US 10,650,215 B2
(45) Date of Patent: May 12, 2020

(54) FINGERPRINT SENSOR AND TERMINAL DEVICE

(71) Applicant: SHENZHEN GOODIX TECHNOLOGY CO., LTD., Shenzhen (CN)

(72) Inventor: Mengwen Zhang, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 105 days.

(21) Appl. No.: 16/150,261

(22) Filed: Oct. 2, 2018

(65) Prior Publication Data

US 2019/0138781 A1 May 9, 2019

Related U.S. Application Data

(63) Continuation of application No. PCT/CN2017/106737, filed on Oct. 18, 2017.

(51) Int. Cl.
| | |
|---|---|
| G06K 9/00 | (2006.01) |
| H03K 17/693 | (2006.01) |
| H03K 17/96 | (2006.01) |

(52) U.S. Cl.
CPC ......... *G06K 9/0002* (2013.01); *H03K 17/693* (2013.01); *H03K 17/962* (2013.01)

(58) Field of Classification Search
None
See application file for complete search history.

(56) References Cited

U.S. PATENT DOCUMENTS

| | | | |
|---|---|---|---|
| 7,570,789 B2 | 8/2009 | Fujiyoshi | |
| 8,564,311 B2 | 10/2013 | Ningrat | |
| 9,600,707 B1 | 3/2017 | Ramberg et al. | |
| 2005/0226478 A1 | 10/2005 | Fujiyoshi | |
| 2012/0001643 A1 | 1/2012 | Ningrat | |
| 2016/0350577 A1* | 12/2016 | Yang | G06K 9/00053 |
| 2017/0235993 A1 | 8/2017 | Xu et al. | |
| 2018/0276441 A1* | 9/2018 | Yeo | G06K 9/0002 |
| 2018/0330139 A1 | 11/2018 | Yang et al. | |

(Continued)

FOREIGN PATENT DOCUMENTS

| | | |
|---|---|---|
| CN | 1680818 A | 10/2005 |
| CN | 105046194 A | 11/2015 |

(Continued)

*Primary Examiner* — Joseph R Haley

(57) ABSTRACT

A fingerprint sensor and a terminal device are provided, including: a first drive circuit, configured to generate a periodic driving signal according to a periodic first input signal, periods of the first input signal and the driving signal being both a predetermined period; each second drive circuit corresponding to a column of voltage integrators respectively, the each second drive circuit being configured to generate a column select signal according to a second input signal, the column select signal being used for controlling an operating state of a corresponding column of voltage integrators; and each of N columns of voltage integrators configured to receive the driving signal and the column select signal generated by a corresponding second drive circuit, and charge or integrate a fingerprint capacitor according to the driving signal and the column select signal.

17 Claims, 5 Drawing Sheets

(56) References Cited

U.S. PATENT DOCUMENTS

2019/0012503 A1* 1/2019 Wu .................. H03F 3/45076
2019/0102591 A1* 4/2019 Lee .................. G06K 9/00053

FOREIGN PATENT DOCUMENTS

| CN | 107223303 A | 9/2017 |
| CN | 107251047 A | 10/2017 |
| WO | 2017/052068 A1 | 3/2017 |

* cited by examiner

FINGERPRINT SENSOR AND TERMINAL DEVICE

CROSS-REFERENCE TO RELATED APPLICATIONS

This application is a continuation of international application No. PCT/CN2017/106737, with an international filing date of Oct. 18, 2017, which is hereby incorporated by reference in its entirety.

TECHNICAL FIELD

Embodiments of the present application relate to the field of fingerprint detection, and more particularly, to a fingerprint sensor and a terminal device.

BACKGROUND

The existing fingerprint detection scheme includes a capacitive fingerprint detection scheme, which can be categorized into mutual capacitance driving scheme and self-capacitance driving scheme according to a driving type. Compared with the mutual capacitance driving scheme, the self-capacitance driving scheme has greater advantages in cost and power consumption, however, since a switch in the self-capacitance driving scheme is a metal oxide semiconductor (Metal Oxide Semiconductor, MOS) transistor inside a chip, and a withstand voltage of the MOS transistor is not high, a value of an input signal is limited, and a signal-to-noise ratio (SNR) could not be improved by increasing an input voltage. Therefore, a fingerprint sensor is required to improve an SNR of a self-capacitance driving mode.

SUMMARY

Embodiments of the present application provide a fingerprint sensor and a terminal device, which can improve a driving voltage of self-capacitance driving, and further, improve an SNR of a self-capacitance driving mode.

In a first aspect, provided is a fingerprint sensor, including a first drive circuit, N second drive circuits, and N columns of voltage integrators, N>1, where the first drive circuit is configured to generate a periodic driving signal according to a periodic first input signal, and periods of the first input signal and the driving signal are both a predetermined period, where, in a first time period of the predetermined period, the first input signal is at a high level, and the driving signal is a first voltage; in other time period of the predetermined period, the first input signal is at a low level, and the driving signal is a second voltage; and both the first voltage and the second voltage are greater than zero, and the first voltage is smaller than the second voltage;

each second drive circuit corresponds to a column of voltage integrators, the each second drive circuit is configured to generate a column select signal according to a second input signal, and the column select signal is used for controlling an operating state of a corresponding column of voltage integrators, where when the second input signal is at a low level, the column select signal is the second voltage; and when the second input signal is at a high level, the column select signal is the first voltage; and each voltage integrator of the N columns of voltage integrators is configured to receive the driving signal and the column select signal generated by a corresponding second drive circuit, and charge or integrate a fingerprint capacitor according to the driving signal and the column select signal.

Optionally, in an embodiment of the present application, the low level may be zero, the high level may be the first voltage, and the second voltage may be twice the first voltage. Therefore, according to a fingerprint sensor in the embodiment of the present application, the first drive circuit can increase a driving voltage to twice the original driving voltage, and therefore, an SNR of a self-capacitance driving mode could be improved.

Optionally, in an embodiment of the present application, the N columns of voltage integrators are voltage integrators of M rows and N columns, that is, each column of voltage integrators includes M voltage integrators.

It should be noted that the fingerprint capacitor is a capacitor generated by a user pressing the fingerprint sensor.

In conjunction with the first aspect, in some implementation manners of the first aspect, the first drive circuit includes a first buffer, a first inverter, and a first capacitor;

where an input terminal of the first inverter is configured to input the first input signal, and an output terminal of the first inverter is configured to output a first inverting input signal;

a first terminal of the first buffer is configured to input the first voltage, a second terminal of the first buffer is connected to a fourth terminal of the first buffer, a third terminal of the first buffer is configured to input the first inverting input signal, and the fourth terminal of the first buffer is configured to output the driving signal; and a first terminal of the first capacitor is connected to the fourth terminal of the first buffer, and a second terminal of the first capacitor is connected to the output terminal of the first inverter.

In conjunction with the first aspect, in some implementation manners of the first aspect, when the first input signal is at a high level, the first inverting output signal is at a low level, the driving signal is the first voltage, the first terminal of the first capacitor is the first voltage, and the second terminal of the first capacitor is at a low level; and when the first input signal is at a low level, the first inverting output signal is at a high level, the second terminal of the first capacitor is the first voltage, and the first terminal of the first capacitor is the second voltage.

In conjunction with the first aspect, in some implementation manners of the first aspect, the second drive circuit includes a second buffer, a second inverter and a second capacitor, where an input terminal of the second inverter is configured to input the second input signal, and an output terminal of the second inverter is configured to output a second inverting input signal;

a first terminal of the second buffer is configured to input the first voltage, a second terminal of the second buffer is connected to a fourth terminal of the second buffer, a third terminal of the second buffer is configured to input the second inverting input signal, and the fourth terminal of the second buffer is configured to output the column select signal; and a first terminal of the second capacitor is connected to the fourth terminal of the second buffer, and a second terminal of the second capacitor is connected to the output terminal of the second inverter.

In conjunction with the first aspect, in some implementation manners of the first aspect, when the second input signal is at a high level, the second inverting input signal is at a low level, the column select signal is the first voltage, the first terminal of the second capacitor is the first voltage, and the second terminal of the second capacitor is at a low level; and when the second input signal is at a low level, the second inverting input signal is at a high level, the second terminal of the second capacitor is the first voltage, and the first terminal of the second capacitor is the second voltage.

In conjunction with the first aspect, in some implementation manners of the first aspect, each of the voltage integrators includes a first switch circuit, a second switch circuit, and an integration circuit, where the first switch circuit is configured to receive the driving signal and the column select signal and output a first output signal, the driving signal and the column select signal are used for controlling turnon and turnoff of the first switch circuit, and an output terminal of the first switch circuit is connected to the fingerprint capacitor; and the second switch circuit is configured to receive the first output signal and the first input signal, and the first output signal and the first input signal are used for controlling turnon and turnoff of the second switch circuit, where when the driving signal is the second voltage and the column select signal is the first voltage, the first switch circuit is turned on, the second switch circuit is turned off, and the first drive circuit charges the fingerprint capacitor with the second voltage; and when the column select signal is the second voltage, the first output signal is the second voltage and the first input signal is at a high level, the first switch circuit is turned off, the second switch circuit is turned on, and the integration circuit integrates the fingerprint capacitor.

That is, when the first input signal is zero and the second input signal is $V_{DD}$, the driving signal is $2V_{DD}$, the column select signal is $V_{DD}$, the first switch circuit is turned on, the second switch circuit is turned off, and the fingerprint capacitor may be charged with $2V_{DD}$; and when the first input signal is $V_{DD}$ and the second input signal is zero, the driving signal is $V_{DD}$, the column select signal is $2V_{DD}$, the second switch circuit is turned on, the first switch circuit is turned off, and the integration circuit integrates the fingerprint capacitor.

In conjunction with the first aspect, in some implementation manners of the first aspect, the first switch circuit includes a first switch device and a second switch device, where a first terminal of the first switch device is configured to input the driving signal, a second terminal of the first switch device is configured to input the column select signal, and a third terminal of the first switch device is connected to a first terminal of the second switch device; and a second terminal of the second switch device is configured to input the first voltage, and a third terminal of the second switch device is configured to output the first output signal.

In conjunction with the first aspect, in some implementation manners of the first aspect, the first switch circuit further includes a third buffer, a first terminal of the third buffer is configured to input the first voltage, a second terminal of the third buffer is configured to input the driving signal, a third terminal of the third buffer is configured to input the second input signal, and a fourth terminal of the third buffer is connected to the third terminal of the first switch device.

In conjunction with the first aspect, in some implementation manners of the first aspect, when the column select signal is the second voltage, the first switch device is turned off, the second switch device is turned off, and the first output signal is the first voltage; and when the driving signal is the second voltage, and the column select signal is the first voltage, the first switch device is turned on, the second switch device is turned on, the first output signal is the second voltage, and the first drive circuit charges the fingerprint capacitor with the second voltage.

Therefore, in a circuit structure of a fingerprint sensor according to an embodiment of the present application, a voltage difference between any two terminals of a switch device does not exceed $V_{DD}$, thereby ensuring that the switch device is free from overvoltage.

In conjunction with the first aspect, in some implementation manners of the first aspect, the second switch circuit includes a third switch device and a third inverter, where a first terminal of the third switch device is configured to input the first output signal, a second terminal of the third switch device is configured to input the first voltage, and a third terminal of the third switch device is connected to a fourth terminal of the third inverter; and a first terminal of the third inverter is configured to input the first input signal, a second terminal of the third inverter is configured to input the first voltage, and a third terminal of the third inverter is connected to a first input terminal of the integration circuit.

In conjunction with the first aspect, in some implementation manners of the first aspect, when the first input signal is at a low level, an output of the four terminal of the third inverter is the first voltage, and the third switch device is turned off; and when the first input signal is at a high level, an output of the four terminal of the third inverter is a low level, the third switch device is turned on, the first output signal is input to the first input terminal of the integration circuit, and the integration circuit integrates the fingerprint capacitor.

In conjunction with the first aspect, in some implementation manners of the first aspect, each column of voltage integrators further includes a third switch circuit, and the third switch circuit includes a fourth buffer and a fourth switch device, where a first terminal of the fourth buffer is configured to input the first voltage, a second terminal of the fourth buffer is configured to input the driving signal, a third terminal of the fourth buffer is configured to input an inverting signal of the first input signal, and a fourth terminal of the fourth buffer is connected to a third terminal of the fourth switch device; and a first terminal of the fourth switch device is configured to input the driving signal, a second terminal of the fourth switch device is configured to input the column select signal, and the third terminal of the fourth switch device is connected to the first switch circuit.

In conjunction with the first aspect, in some implementation manners of the first aspect, when the column select signal is the second voltage, the fourth switch device is turned off, and when the first input signal is at a low level, the fourth terminal of the fourth buffer is the first voltage; and when the driving signal is the second voltage, and the column select signal is the first voltage, the fourth switch device is turned on, and the fourth terminal of the fourth buffer is the second voltage.

In conjunction with the first aspect, in some implementation manners of the first aspect, the low level is zero and the high level is the first voltage.

In conjunction with the first aspect, in some implementation manners of the first aspect, the second voltage is twice the first voltage.

In conjunction with the first aspect, in some implementation manners of the first aspect, when the second input signal is a periodically varying signal, a column of voltage integrators corresponding to the second drive circuit are enabled; and the period of the second input signal is the predetermined period, in the first time period of the predetermined period, the second input signal is at a low level, and in other time period of the predetermined period, the second input signal is at a high level.

In a second aspect, provided is a terminal device, including the fingerprint sensor in the first aspect and any one of possible implementation manners of the first aspect.

DESCRIPTION OF EMBODIMENTS

Embodiments of the present application will be described hereinafter with reference to the accompanying drawings.

Figure 1:
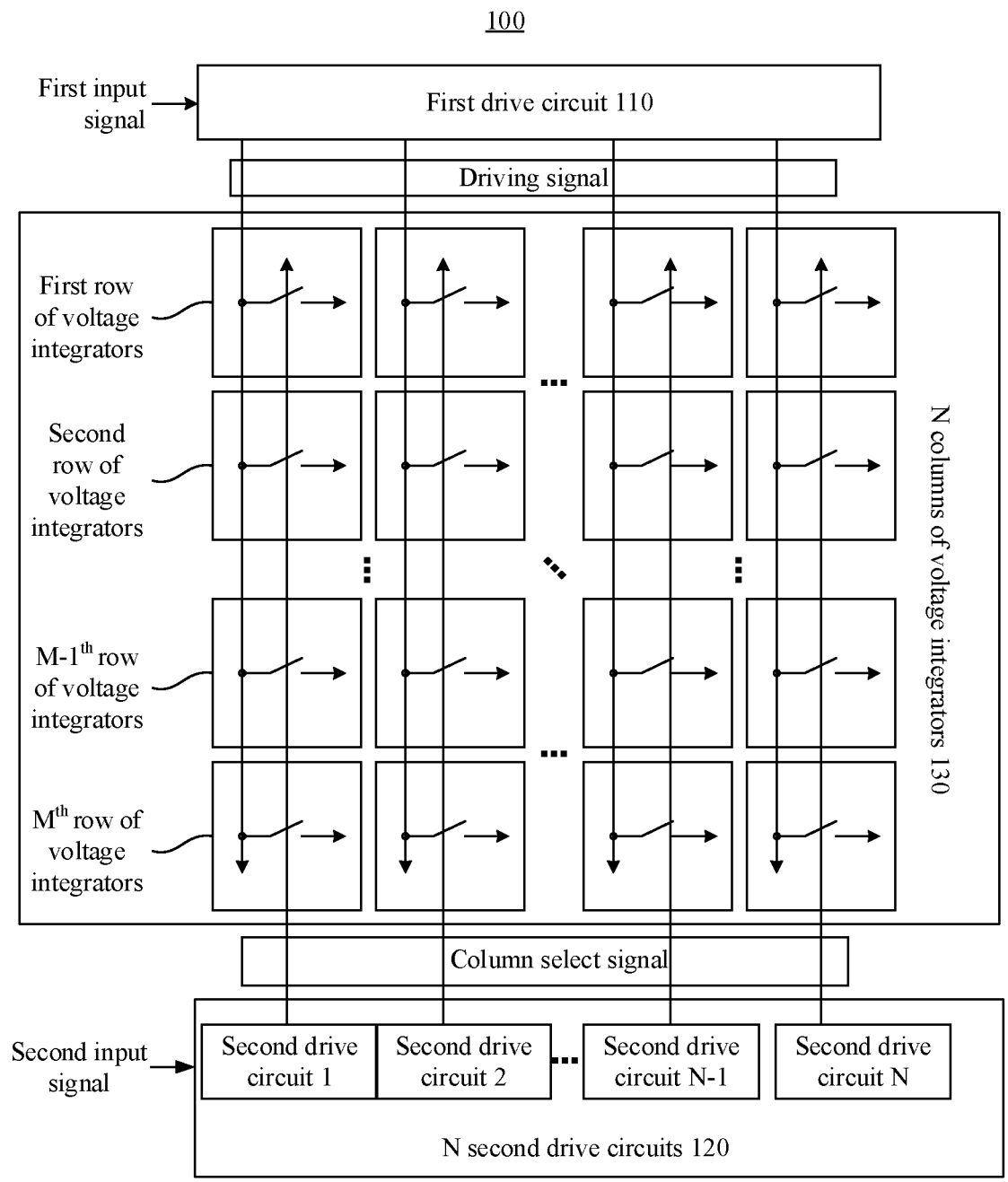
FIG. 1 is a schematic structural diagram of a fingerprint sensor according to an embodiment of the present application.

FIG. 1 is a schematic structural diagram of a fingerprint sensor 100 according to an embodiment of the present application. As shown in FIG. 1, the fingerprint sensor 100 includes: a first drive circuit 110, N second drive circuits 120, and N columns of voltage integrators 130.

The first drive circuit 110 is configured to generate a periodic driving signal according to a periodic first input signal, and periods of the first input signal and the driving signal are both a predetermined period, where, in a first time period of the predetermined period, the first input signal is at a high level, and the driving signal is a first voltage; in other time period of the predetermined period, the first input signal is at a low level, and the driving signal is a second voltage; and both the first voltage and the second voltage are greater than zero, and the first voltage is smaller than the second voltage.

Specifically, in the embodiment of the present application, an input signal of the first drive circuit is the first input signal, denoted as Vck, which is a periodic clock signal and period of which is a predetermined period. The first drive circuit may generate a periodic driving signal according to the first input signal, and a period of the driving signal is the same as that of the first input signal, i.e., the predetermined period, too. In each period, the driving signal switches between the first voltage and the second voltage according to a change in the level of the first input signal. Specifically, in one period, when the first input signal is at a high level, the driving signal is the first voltage; and when the second input signal is at a low level, the driving signal is the second voltage.

Each second drive circuit 120 corresponds to a column of voltage integrators, the each second drive circuit is configured to generate a column select signal according to a second input signal, and the column select signal is used for controlling an operating state of a corresponding column of voltage integrators, where N>1, where when the second input signal is at a low level, the column select signal is the second voltage; and when the second input signal is at a high level, the column select signal is the first voltage.

That is, each second drive circuit may be configured to control an operating state of a corresponding column of voltage integrators. Specifically, the second drive circuit may generate a column select signal according to the second input signal, and control the corresponding column of voltage integrators to be in a disabled (or deactivated) state or an enabled state through the column select signal.

Specifically, the second drive circuit may control the column select signal to output the second voltage when the second input signal is at a low level, and control the column select signal to output the first voltage when the second input signal is at a high level. For example, the second drive circuit may control the corresponding column of voltage integrators to be in a disabled state when the column select signal is the second voltage.

Each voltage integrator of the N columns of voltage integrators 130 is configured to receive the driving signal and the column select signal generated by a corresponding second drive circuit, and charge or integrate a fingerprint capacitor according to the driving signal and the column select signal.

Specifically, when the voltage integrators 130 are in an enabled state, the voltage integrators 130 may integrate a fingerprint capacitor through an integration circuit in the voltage integrators 130 when the column select signal is the second voltage; alternatively, the voltage integrators 130 may charge the fingerprint capacitor through the first drive circuit with the second voltage when the driving signal is the second voltage and column select signal is the first voltage.

Optionally, in an embodiment of the present application, the voltage integrators may include an integration circuit, the integration circuit may include an operational amplifier and an integration capacitor, and the voltage integrators may integrate the fingerprint capacitor through the integration capacitor.

Optionally, in an embodiment of the present application, the low level may be zero, the high level may be the first voltage, and if the first voltage is denoted as $V_{DD}$ or $V_{dd1x}$, the second voltage may be twice the first voltage, i.e., $2V_{DD}$ or $V_{dd2x}$. Therefore, according to a fingerprint sensor in an embodiment of the present application, the first drive circuit could increase a driving voltage to $2V_{DD}$, and thus an SNR of a self-capacitance driving mode could be improved.

It should be noted that, in an embodiment of the present application, a fingerprint capacitor refers to a capacitor generated by a user pressing a fingerprint sensor, or the fingerprint capacitor is a capacitor formed between a layer of metal integrated in a circuitry of a fingerprint sensor and a finger.

It should be understood that, in an embodiment of the present application, the N columns of voltage integrators may be voltage integrators of M rows by N columns, and in other words, the number of each column of voltage integrators may be the same, i.e., the N columns of voltage integrators are a regular array of M rows by N columns; alternatively, the number of each column of voltage integrators may also be different, i.e., the N columns of voltage integrators may be an irregular array as well, which is not limited in an embodiment of the present application. FIG. 1 merely takes the N columns of voltage integrators being a regular array of M rows and N columns as an example, and should not be construed as limiting an embodiment of the present application.

It should also be understood that, in an embodiment of the present application, the first drive circuit may also be referred to as a driving circuit, or a driving charge pump. Similarly, the second drive circuit may also be referred to as a column select circuit, or a column select charge pump. The driving signal output by the first drive circuit may also be referred to as a drive signal, and the driving signal is a periodically varying clock signal, which alternates between a first voltage and a second voltage in each predetermined period, and as a result, the first drive circuit could drive a fingerprint capacitor with the first voltage and the second voltage alternately.

Hereinafter, a logic timing diagram of a fingerprint sensor according to an embodiment of the present application will be described in detail with reference to FIG. 2.

Figure 2:
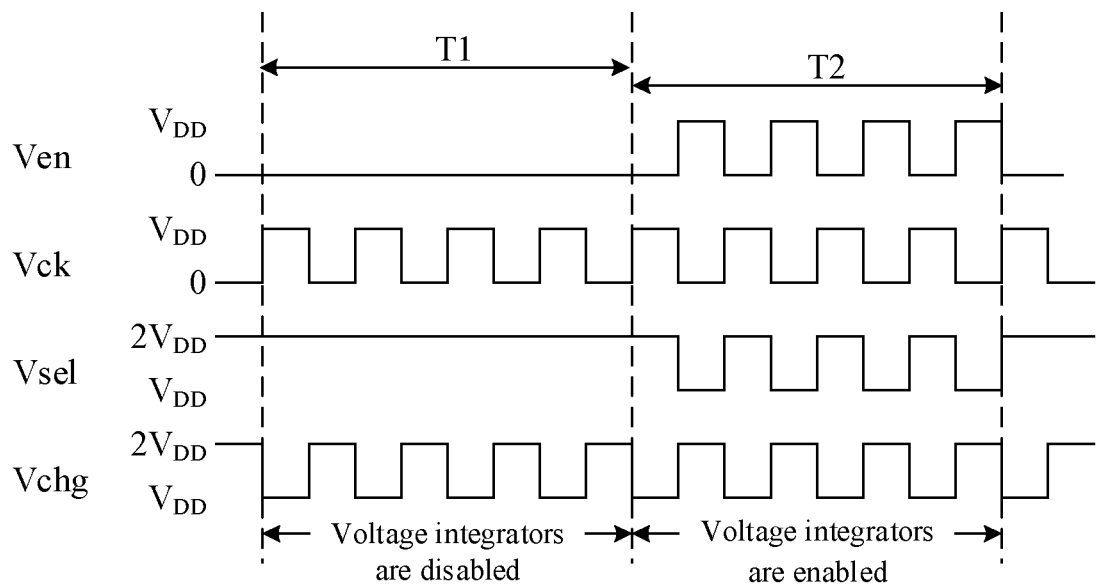
FIG. 2 is a logic timing diagram of a fingerprint sensor according to an embodiment of the present application.

As shown in FIG. 2, in a time period T1, a second input signal (denoted as Ven) of a second drive circuit is at a low level, and a column of voltage integrators corresponding to the second drive circuit are in a disabled state; and in a time period T2, the second input signal Ven of the second drive circuit is a periodically varying clock signal, and a column of voltage integrators corresponding to the second drive circuit are in an enabled state. In T2, the period of the first input signal Vck is the same as that of the second input signal Ven, and in the same period, a phase of Vck is opposite to that of Ven; and an inverting input signal of Vck is denoted as Vckn, and thus a waveform of Vckn is the same as that of Ven. According to the first input signal Vck, a driving signal (denoted as Vchg) output by the first drive circuit is also a periodically varying signal, and a period of the driving signal Vchg is the same as that of Vck, that is, the driving signal switches between $2V_{DD}$ and $V_{DD}$ periodically. Similarly, a column select signal (denoted as Vsel) output by the second drive circuit also switches between $2V_{DD}$ and $V_{DD}$ periodically.

Specifically, in the embodiment of the present application, when the voltage integrators are in an enabled state, if Vchg=$2V_{DD}$, Vsel=$V_{DD}$, the driving signal output by the first drive circuit may charge a fingerprint capacitor, that is, the first drive circuit charges the fingerprint capacitor with $2V_{DD}$, and therefore, an SNR of self-capacitance driving could be improved. Alternatively, if Vsel=$2V_{DD}$, Vck=$V_{DD}$, an integration circuit in the voltage integrators may integrate the fingerprint capacitor.

In order to implement the logic timing shown in FIG. 2, implementation manners of a fingerprint sensor according to embodiments of the present application are described in detail below with reference to specific examples in FIGS. 3 to 11.

It should be understood that examples shown in FIGS. 3 to 11 are for helping those skilled in the art better understand embodiments of the present application, rather than for limiting the scope of the embodiments of the present application. It will be obvious for those skilled in the art to make various equivalent modifications or variations according to FIGS. 3 to 11 as illustrated, and these modifications or variations shall also fall within the scope of the embodiments of the present application.

It should be noted that embodiments of the present application are described by taking a case that a low level is grounded, i.e., the low level is zero, a high level is $V_{DD}$, the first voltage is $V_{DD}$, and the second voltage is $2V_{DD}$ as an example. However, the embodiments of the present application are not limited thereto, and other voltage relationships obtained according to teachings of the embodiments of the present application also fall within the protection scope of the embodiments of the present application.

Figure 3:
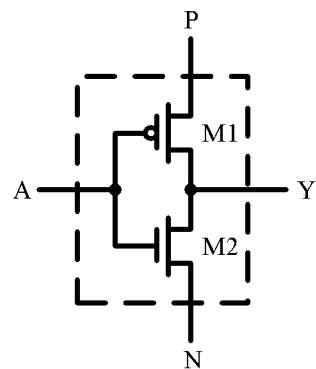
FIG. 3 is a schematic diagram of a typical structure of an inverter.
Figure 4:
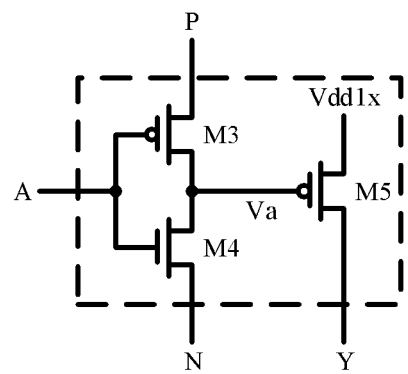
FIG. 4 is a schematic diagram of a typical structure of a buffer.

With reference to FIGS. 3 and 4, two typical circuits involved in embodiments of the present application are briefly introduced.

FIG. 3 is a schematic diagram of a typical structure of an inverter. As shown in FIG. 3, the inverter may include a MOS transistor M1 and a MOS transistor M2. Optionally, the M1 may be a P-channel metallic oxide semiconductor field effect transistor (Metallic Oxide Semiconductor Field Effect Transistor, MOSFET), and the M2 may be an N-channel MOSFET.

The inverter has four terminals, which are an A terminal, a P terminal, an N terminal, and a Y terminal. The A terminal, the P terminal, and the N terminal are input terminals, and the Y terminal is an output terminal. In an embodiment of the present application, if a specific connection relationship is not indicated, the P terminal is connected to $V_{DD}$, and the N terminal is grounded.

When $V_{DD}$ is input to the A terminal, the M2 is turned on, and the Y terminal outputs zero; and when zero is input to the A terminal, the M1 is turned on, and the Y terminal outputs $V_{DD}$.

FIG. 4 is a schematic diagram of a typical structure of a buffer. As shown in FIG. 4, the buffer may include a MOS transistor M3, a MOS transistor M4, and a MOS transistor M5, where the M3 is a P-channel MOSFET, the M4 is an N-channel MOSFET, and the M5 is a P-channel MOSFET.

The buffer also has four terminals, which are an A terminal, a P terminal, an N terminal, and a Y terminal. The A terminal, the P terminal, and the N terminal are input terminals, and the Y terminal is an output terminal. In an embodiment of the present application, if a specific connection relationship is not indicated, the P terminal is connected to $V_{DD}$, and the N terminal is grounded.

Figure 5:
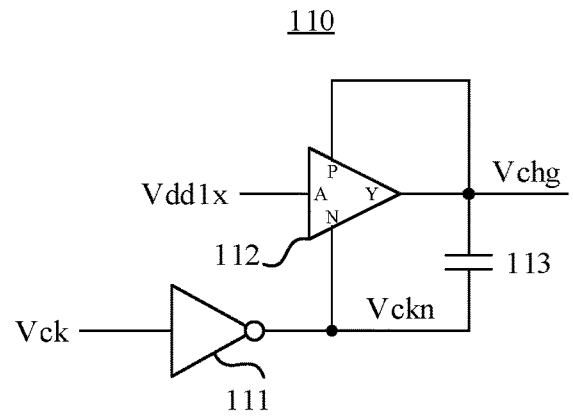
FIG. 5 is a schematic structural diagram of a first drive circuit according to an embodiment of the present application.

When $V_{DD}$ is input to the A terminal, the M4 is turned on, Va outputs zero, the M5 is turned on, and the Y terminal outputs $V_{dd1x}$, i.e., $V_{DD}$; and when zero is input to the A terminal, the M3 is turned on, Va outputs $V_{DD}$, and M5 is turned off FIG. 5 is a schematic structural diagram of a first drive circuit according to an embodiment of the present application. As shown in FIG. 5, the first drive circuit 110 includes a first buffer 112, a first inverter 111, and a first capacitor 113;

where an input terminal of the first inverter 111 is configured to input the first input signal, and an output terminal of the first inverter 111 is configured to output a first inverting input signal;

a first terminal (corresponding to an A terminal in FIG. 5) of the first buffer 112 is configured to input the first voltage, a second terminal (corresponding to a P terminal in FIG. 5) of the first buffer 112 is connected to a fourth terminal (corresponding to a Y terminal in FIG. 5) of the first buffer 112, a third terminal (corresponding to an N terminal in FIG. 5) of the first buffer 112 is configured to input the first inverting input signal, and the fourth terminal of the first buffer 112 is configured to output the driving signal; and a first terminal of the first capacitor 113 is connected to the fourth terminal of the first buffer, and a second terminal of the first capacitor is connected to the output terminal of the first inverter.

Optionally, the first inverter 111 may be implemented with the typical structure of the inverter in FIG. 3, or other equivalent circuits as well, and the first buffer 112 may be implemented with the typical structure of the buffer in FIG. 4, or other equivalent circuits as well, which are not specifically limited in the embodiment of the present application.

Hereinafter, as an example, the first inverter 111 adopts the structure shown in FIG. 3, and the first buffer adopts the structure as illustrated in FIG. 4, an operating principle of the first drive circuit 110 is described in detail.

Specifically, when the first input signal Vck is $V_{DD}$, the first inverting output signal (denoted as Vckn) output by the first inverter 111 is 0, that is, the second terminal (or a lower plate) of the first capacitor is zero. Meanwhile, the N terminal of the first buffer 112 is 0 as well, the A terminal of the first buffer 112 is $V_{dd1x}$, and therefore an M4 in the first buffer 112 is turned on, Va outputs zero, an M5 is turned on, and the Y terminal outputs $V_{DD}$, that is, the driving signal Vchg output by the first drive circuit is $V_{DD}$, and in the meantime, the first terminal (or an upper plate) of the first capacitor 113 connected to the Y terminal of the first buffer 112 is $V_{DD}$ as well.

When the first input signal Vck is 0, Vckn is $V_{DD}$, that is, the lower plate of the first capacitor is $V_{DD}$. Since a voltage drop across the first capacitor 113 is constant, the voltage of the upper plate of the first capacitor 113 turns into $2V_{DD}$, that is, the driving signal Vchg output by the first drive circuit is $2V_{DD}$.

Optionally, in an embodiment of the present application, a second drive circuit may also be implemented with a structure similar to that of a first drive circuit. An operating principle of the second drive circuit may refer to the operating principle of the first drive circuit, and details are not described herein again.

Hereinafter, an implementation manner of a voltage integrator will be described in detail with reference to FIGS. 6 to 11.

Figure 6:
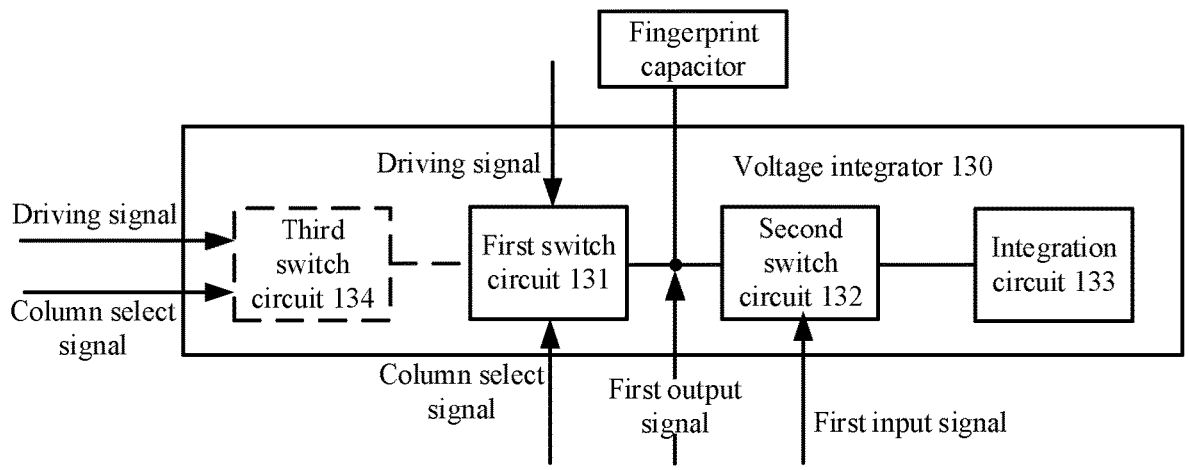
FIG. 6 is a schematic structural diagram of a voltage integrator according to an embodiment of the present application.

FIG. 6 is a schematic structural diagram of a voltage integrator according to an embodiment of the present application. As shown in FIG. 6, the voltage integrator 130 includes a first switch circuit 131, a second switch circuit 132, and an integration circuit 133.

The first switch circuit 131 is configured to receive the driving signal and the column select signal and output a first output signal, the driving signal and the column select signal are used for controlling turnon and turnoff of the first switch circuit, and an output terminal of the first switch circuit is connected to the fingerprint capacitor; and the second switch circuit 132 is configured to receive the first output signal and the first input signal, and the first output signal and the first input signal are used for controlling turnon and turnoff of the second switch circuit, where when the driving signal is the second voltage and the column select signal is the first voltage, the first switch circuit is turned on, the second switch circuit is turned off, and the first drive circuit charges the fingerprint capacitor with the second voltage; and when the column select signal is the second voltage, the first output signal is the second voltage and the first input signal is at a high level, the first switch circuit is turned off, the second switch circuit is turned on, and the integration circuit integrates the fingerprint capacitor.

As can be seen from an operating principle of a first drive circuit, when a first input signal Vck is at a low level, a driving signal Vchg is $2V_{DD}$; and when the first input signal Vck is at a high level, the driving signal Vchg is $V_{DD}$. Similarly, when a second input signal Ven is at a low level, a column select signal Vsel is $2V_{DD}$; and when the second input signal Ven is at a high level, the column select signal Vsel is $V_{DD}$.

Therefore, operating timings of a driving signal and a column select signal can be used to control turnon and turnoff of a first switch circuit and a second switch circuit. Specifically, when the driving signal is $2V_{DD}$ and the column select signal is $V_{DD}$, the first switch circuit 131 is turned on, and the driving signal (or regarded as the first output signal as well) is input to a lower plate of the fingerprint capacitor. At this time, the driving signal is $2V_{DD}$, so the first drive circuit may charge the fingerprint capacitor with $2V_{DD}$. When the column select signal is $2V_{DD}$, the first switch circuit is turned off. In this case, Vck is at a high level, the second switch circuit is turned on, and the fingerprint capacitor is connected to an input terminal of the integration circuit, so that the integration circuit can integrate the fingerprint capacitor.

An operating timing of voltage integrators in an enabled phase (i.e., the T2 phase) is illustrated with reference to the logic timing diagram shown in FIG. 2.

When Vck is zero and Ven is $V_{DD}$, Vchg is $2V_{DD}$, Vsel is $V_{DD}$, the first switch circuit is turned on, the second switch circuit is turned off, and Vchg charges the fingerprint capacitor; and when Vck is $V_{DD}$ and Ven is zero, Vchg is $V_{DD}$, Vsel is $2V_{DD}$, the second switch circuit is turned on, the first switch circuit is turned off, and the integration circuit integrates the fingerprint capacitor.

Hereinafter, an implementation manner of a first switch circuit will be described in detail with reference to specific examples shown in FIGS. 7 to 8.

Figure 7:
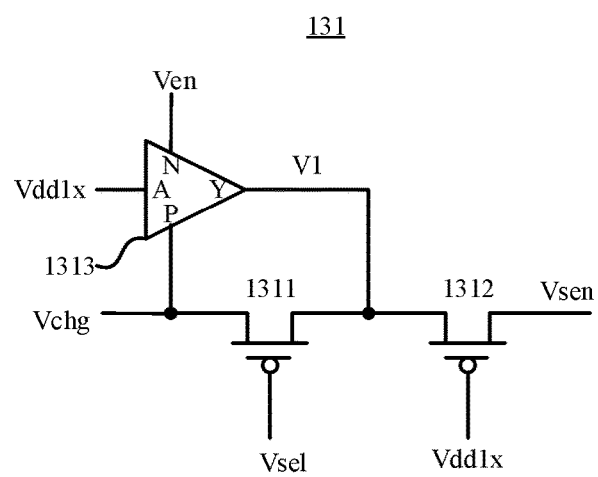
FIG. 7 is a schematic structural diagram of a first switch circuit according to an embodiment of the present application.

FIG. 7 is a schematic diagram of an implementation manner of a first switch circuit according to an embodiment of the present application. As shown in FIG. 7, the first switch circuit includes a first switch device 1311, a second switch device 1312 and a third buffer 1313.

A first terminal of the first switch device 1311 is configured to input the driving signal, a second terminal of the first switch device 1311 is configured to input the column select signal, and a third terminal of the first switch device 1311 is connected to a first terminal of the second switch device 1312; and a second terminal of the second switch device 1312 is configured to input the first voltage, and a third terminal of the second switch device 1312 is configured to output the first output signal (corresponding to Vsen in FIG. 7); and a first terminal (corresponding to an A terminal in FIG. 7) of the third buffer 1313 is configured to input the first voltage, a second terminal (corresponding to a P terminal in FIG. 7) of the third buffer is configured to input the driving signal, a third terminal (corresponding to an N terminal in FIG. 7) of the third buffer is configured to input the second input signal, and a fourth terminal (corresponding to a Y terminal in FIG. 7) of the third buffer is connected to the third terminal of the first switch device 1311.

Hereinafter, an operating principle of the first switch circuit will be described with the third buffer 1313 adopting the structure shown in FIG. 4.

Specifically, when Ven is zero, the column select signal Vsel is $2V_{DD}$, the first switch device 1311 is turned off, V1 at the Y terminal of the third buffer 1313 is $V_{DD}$, and the second switch device 1312 turned off; and when the driving signal Vchg is $2V_{DD}$, and the column select signal Vsel is $V_{DD}$, the first switch device is turned on, the second switch device is turned on, the first output signal Vsen is $2V_{DD}$, and the first drive circuit charges the fingerprint capacitor with $2V_{DD}$.

In an embodiment of the present application, since a driving voltage of $2V_{DD}$ may be provided, it is necessary to ensure that a switch device is free from overvoltage in specific implementation. Specifically, when Vchg is $V_{DD}$ and Vsel is $2V_{DD}$, the first switch device 1311 is turned off; at this time, Ven is zero, Vck is $V_{DD}$, and the P terminal of the third buffer 1313 is $V_{DD}$, and the N terminal is zero, therefore, an M4 in the third buffer 1313 is turned on, Va is 0, an M5 is turned on, and V1 is $V_{DD}$. That is, at this time, a voltage (i.e., Vchg) at the first terminal of the first switch device 1311 is $V_{DD}$, a voltage (i.e., Vsel) at the second terminal is $2V_{DD}$, and a voltage (i.e., V1) at the third terminal is $V_{DD}$, that is, a voltage difference between any two terminals of the first switch device is not greater than $V_{DD}$, thereby ensuring that the first switch device 1311 is free from overvoltage.

When Vchg is $2V_{DD}$ and Vsel is $V_{DD}$, the first switch device 1311 is turned on, and voltages at the first terminal and the third terminal of the first switch device 1311 are equal, that is, Vchg is equal to V1, both are $2V_{DD}$, and the voltage at the second terminal of the first switch device 1311 is $V_{DD}$. Therefore, a voltage difference between any two terminals of the first switch device is not greater than $V_{DD}$, thereby ensuring that the first switch device 1311 is free from overvoltage. In the meantime, Ven is $V_{DD}$, an M3 in the third buffer 1313 is turned on, an M4 is turned off, and Va is $2V_{DD}$, which is beneficial to ensure that switch devices in the third buffer 1313 have no overvoltage problem.

For the second switch device 1312, when the first switch device 1311 is turned on, the second switch device 1312 is always turned on. Therefore, voltages at the first terminal and the third terminal of the second switch device are the same, both are $2V_{DD}$, and meanwhile, the voltage of the second terminal of the second switch device is $V_{DD}$, that is, a voltage difference between any two terminals of the second switch device is not greater than $V_{DD}$, thereby ensuring that the second switch device is free from overvoltage.

When the first switch device 1311 is turned off, Ven is zero, V1 is $V_{DD}$, the second switch device 1312 is turned off, and Vsen at the third terminal of the second switch device 1312 is zero. In this case, a voltage difference between any two terminals of the second switch device 1312 is also not greater than $V_{DD}$, thereby ensuring that the second switch device is free from overvoltage.

Figure 8:
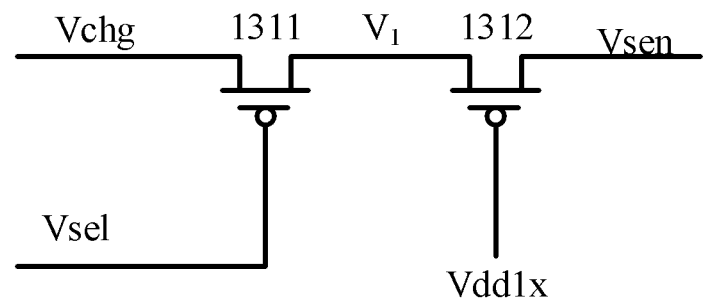
FIG. 8 is a schematic structural diagram of a first switch circuit according to another embodiment of the present application.

As an implementation manner, the first switch circuit may also only include the first switch device 1311 and the second switch device 1312, but exclude the third buffer 1313, and thus is presented as a circuit structure shown in FIG. 8. In this case, operating principles of the first switch device 1311 and the second switch device 1312 are similar to those of the circuit structure shown in FIG. 7, except that the voltage V1 at the third terminal of the first switch device 1311 may result in being lower than $V_{DD}$ due to slow turnoff of the second switch device 1312, and to some extent, there is a risk of overvoltage in the first switch device 1311.

In an embodiment of the present application, each of voltage integrators may be implemented with a first switch circuit and a second switch circuit. Optionally, in the embodiment of the present application, each column of voltage integrators may further include one third switch circuit, that is, N voltage integrators may correspond to one third switch circuit. Optionally, in a case where the third switch circuit is adopted, the second switch device 1312 in the first switch circuit may be removed. Since each of voltage integrators needs one second switch device 1312, while a column of voltage integrators adopt one third switch circuit, it is beneficial to reduce complexity of a voltage integrator array by adopting the third switch circuit and removing the second switch device 1312.

In the embodiment of the present application, the third switch circuit may be configured to block traces between the first drive circuit, the second drive circuit, and the voltage integrators when the voltage integrators are disabled, such that parasitic capacitance observed from a first capacitor of the first drive circuit is greatly reduced, which is beneficial to reduce power consumption of the first drive circuit.

Figure 9:
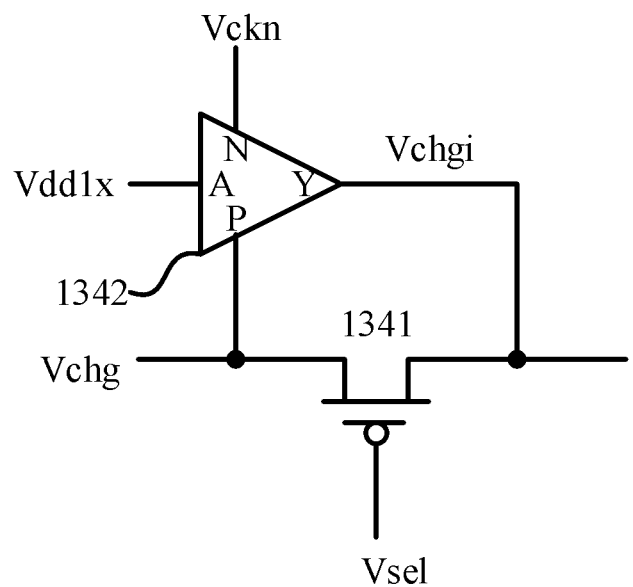
FIG. 9 is a schematic structural diagram of a third switch circuit according to an embodiment of the present application.

FIG. 9 is a schematic structural diagram of a third switch circuit according to an embodiment of the present application. As shown in FIG. 9, the third switch circuit 134 includes a fourth buffer 1342 and a fourth switch device 1341.

A first terminal (corresponding to an A terminal in FIG. 9) of the fourth buffer 1342 is configured to input the first voltage, a second terminal (corresponding to a P terminal in FIG. 9) of the fourth buffer 1342 is configured to input the driving signal, a third terminal (corresponding to an N terminal in FIG. 9) of the fourth buffer 1342 is configured to input an inverting signal of the first input signal, and a fourth terminal (corresponding to a Y terminal in FIG. 9) of the fourth buffer 1342 is connected to a third terminal of the fourth switch device 1341; and a first terminal of the fourth switch device 1341 is configured to input the driving signal, a second terminal of the fourth switch device 1341 is configured to input the column select signal, and the third terminal of the fourth switch device 1341 is connected to the first switch circuit 131.

Here, the inverting signal of the first input signal is the aforementioned Vckn, and the third terminal of the fourth switch device 1341 is connected to the first terminal of the first switch device 1311 in the first switch circuit 131.

Specifically, when Ven is zero and Vsel is $2V_{DD}$, the fourth switch device 1341 is turned off, Vckn is zero, an M4 in the fourth buffer 1342 is turned on, an M5 is turned on, and the Y terminal of the fourth buffer 1342 outputs $V_{DD}$, that is, the third terminal of the fourth switch device 1341 is $V_{DD}$, while the first terminal of the fourth switch device 1341 is $V_{DD}$, and the second terminal of the fourth switch device 1341 is $2V_{DD}$. Therefore, a voltage difference between any two terminals of the fourth switch device 1341 is not greater than $V_{DD}$, thereby ensuring that the fourth switch device 1341 is free from overvoltage. Further, when the fourth switch device 1341 is turned off, a trace between the first switch circuit and the second switch circuit is blocked by the fourth switch device, such that parasitic capacitance observed from a first capacitor of the first drive circuit is reduced, which is beneficial to reduce a power consumption of the first drive circuit.

When Vck is zero and Ven is $V_{DD}$, Vchg is $2V_{DD}$, Vsel is $V_{DD}$, the fourth switch device 1341 is turned on, and voltages at the first terminal and the third terminal of the fourth switch device 1341 are equal, that is, Vchg is equal to Vchgi, and both are $2V_{DD}$. Thus, the first terminal and the third terminal of the fourth switch device are both $2V_{DD}$, and the second terminal of the fourth switch device is $V_{DD}$. Therefore, a voltage difference between any two terminals of the fourth switch device is not greater than $V_{DD}$, thereby ensuring that the fourth switch device is free from overvoltage.

In the meantime, when Vck is $V_{DD}$ and Vckn is 0, the M4 in the fourth buffer 1342 is turned on, and Va is $2V_{DD}$, which is beneficial to ensure that switch devices in the fourth buffer 1342 have no overvoltage problem.

It should be noted that, in an embodiment of the present application, a first switch device, a second switch device, a third switch device, and a fourth switch device may be implemented with a MOS transistor, for example, an N-channel MOS transistor or a P-channel MOS transistor, or may also be implemented with other switch devices, which is not limited in the embodiment of the present application.

Figure 10:
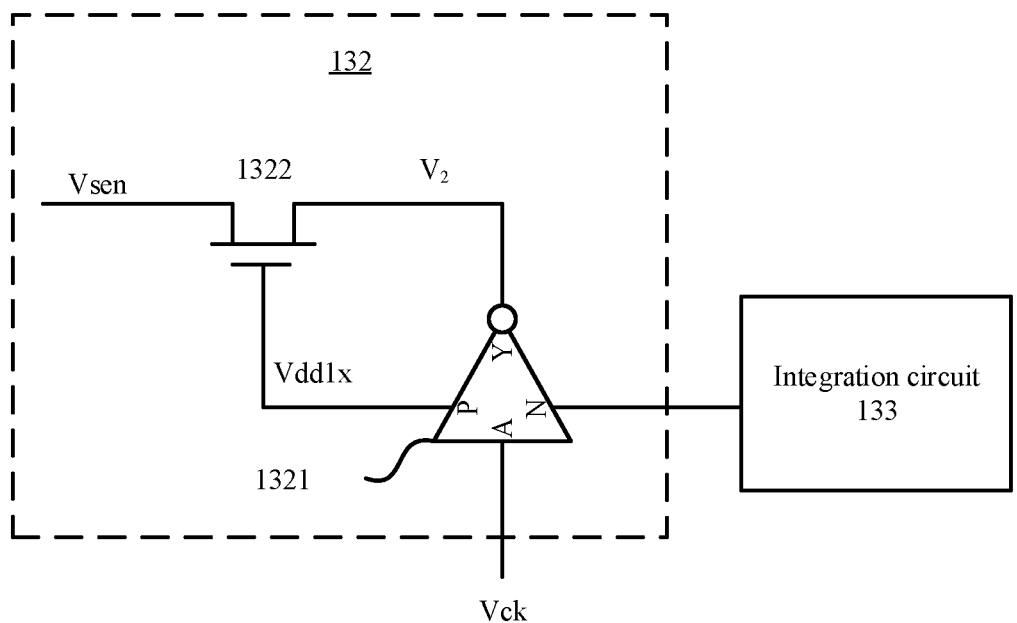
FIG. 10 is a schematic structural diagram of a second switch circuit according to an embodiment of the present application.

FIG. 10 is a schematic structural diagram of a second switch circuit according to an embodiment of the present application. As shown in FIG. 10, the second switch circuit 132 includes a third switch device 1322 and a third inverter 1321.

A first terminal of the third switch device 1322 is configured to input the first output signal (corresponding to Vsen in FIG. 10), a second terminal of the third switch device 1322 is configured to input the first voltage, and a third terminal of the third switch device 1322 is connected to a fourth terminal of the third inverter; and a first terminal of the third inverter 1321 is configured to input the first input signal, a second terminal of the third inverter 1321 is configured to input the first voltage, and a third terminal of the third inverter 1321 is connected to a first input terminal of the integration circuit.

It can be seen from the above description that when Vck is zero and Ven is $V_{DD}$, Vchg is $2V_{DD}$, Vsel is $V_{DD}$, the first switch device and the second switch device are turned on, and the first output signal Vsen is $2V_{DD}$, that is, the first terminal of the third switch device 1322 is $2V_{DD}$, and the second terminal of the third switch device 1322 is $V_{DD}$. Therefore, the third switch device 1322 is turned off. Then, Vck turns into $V_{DD}$, an output terminal of the third inverter 1321, i.e., the Y terminal, outputs zero, the third switch device 1322 is turned on, and the first output signal Vsen is input to the first input terminal of the integration circuit 133, so that the integration circuit 133 can integrate the fingerprint capacitor.

Figure 11:
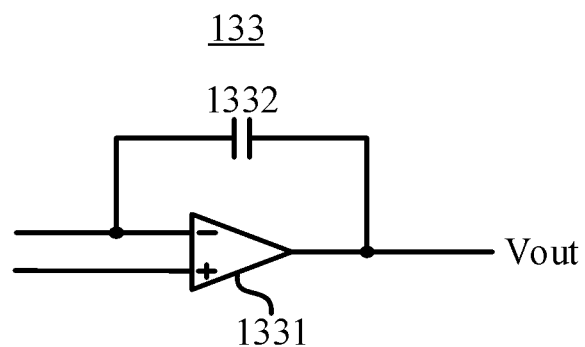
FIG. 11 is a schematic structural diagram of an integration circuit according to an embodiment of the present application.

FIG. 11 is a schematic structural diagram of an integration circuit according to an embodiment of the present application. As shown in FIG. 11, the integration circuit 133 includes an operational amplifier 1331 and an integration capacitor 1332.

An inverting input terminal of the operational amplifier 1331 is connected to the third terminal (i.e., the N terminal) of the third inverter 1321 in the second switch circuit 132, and two terminals of the integration capacitor 1332 are respectively connected to the inverting input terminal of the operational amplifier 1331 and an output terminal of the operational amplifier 1331.

As can be seen from the above description, when Vck is zero, Vsel is $2V_{DD}$, and then Vck is $V_{DD}$, the third switch device 1322 is turned on, and Vsel is input to the first input terminal of the integration circuit, i.e., the inverting input terminal of the operational amplifier 1331 shown in FIG. 11, so that the integration capacitor 1332 can integrate a charge in the fingerprint capacitor to obtain Vout. Since each of voltage integrators may output a Vout, and a fingerprint sensor in an embodiment of the present application include voltage integrators of M rows by N columns, a matrix composed of M rows and N columns of Vouts can be output, and the matrix may be used by the fingerprint sensor to determine a fingerprint image, and further, to perform an operation such as fingerprint identification or fingerprint registration according to the fingerprint image.

It should be noted that when a switch device is turned on, there exists a certain loss in the switch device itself in fact, but the loss is small and can be ignored. Therefore, in an embodiment of the present application, voltages at both terminals are deemed to be approximately equal when a switch device is turned on.

Figure 12:
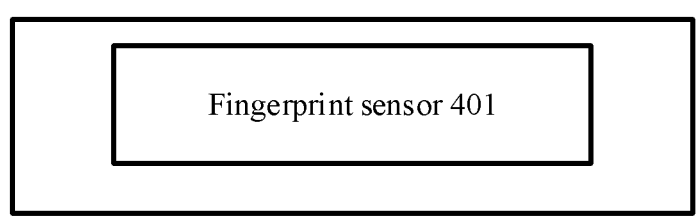
FIG. 12 is a schematic structural diagram of a terminal device according to an embodiment of the present application.

An embodiment of the present application further provides a terminal device. FIG. 12 is a schematic structural diagram of a terminal device 400 according to an embodiment of the present application. As shown in FIG. 12, the terminal device may include a fingerprint sensor 401 which may be the fingerprint sensor 100 described in the previous embodiments.

By way of example and not limitation, the terminal device 400 may be a mobile phone, a tablet computer, a notebook computer, a desktop computer, an in-vehicle electronic device, a wearable smart device, or the like.

Described above are the specific embodiments of the present application only, but the protection scope of the present application is not limited to this, those skilled who are familiar with the art could readily think of variations or substitutions within the technical scope disclosed by the present application, and these variations or substitutions shall fall within the protection scope of the present application. Therefore, the protection scope of the claims should prevail over the protection scope of the present application.

What is claimed is:

1. A fingerprint sensor, comprising: a first drive circuit, N second drive circuits, and N columns of voltage integrators, N>1, wherein the first drive circuit is configured to generate a periodic driving signal according to a periodic first input signal, and periods of the first input signal and the driving signal are both a predetermined period, wherein, in a first time period of the predetermined period, the first input signal is at a high level, and the driving signal is a first voltage; in other time period of the predetermined period, the first input signal is at a low level, and the driving signal is a second voltage; and both the first voltage and the second voltage are greater than zero, and the first voltage is smaller than the second voltage;

each second drive circuit corresponds to a column of voltage integrators respectively, the each second drive circuit is configured to generate a column select signal according to a second input signal, and the column select signal is used for controlling an operating state of a corresponding column of voltage integrators, wherein when the second input signal is at a low level, the column select signal is the second voltage; and when the second input signal is at a high level, the column select signal is the first voltage; and each voltage integrator of the N columns of voltage integrators is configured to receive the driving signal and the column select signal generated by a corresponding second drive circuit, and charge or integrate a fingerprint capacitor according to the driving signal and the column select signal.

2. The fingerprint sensor according to claim 1, wherein the first drive circuit comprises a first buffer, a first inverter, and a first capacitor, wherein an input terminal of the first inverter is configured to input the first input signal, and an output terminal of the first inverter is configured to output a first inverting input signal;

a first terminal of the first buffer is configured to input the first voltage, a second terminal of the first buffer is connected to a fourth terminal of the first buffer, a third terminal of the first buffer is configured to input the first inverting input signal, and the fourth terminal of the first buffer is configured to output the driving signal; and a first terminal of the first capacitor is connected to the fourth terminal of the first buffer, and a second terminal of the first capacitor is connected to the output terminal of the first inverter.

3. The fingerprint sensor according to claim 2, wherein when the first input signal is at a high level, the first inverting output signal is at a low level, the driving signal is the first voltage, the first terminal of the first capacitor is the first voltage, and the second terminal of the first capacitor is at a low level; and when the first input signal is at a low level, the first inverting output signal is at a high level, the second terminal of the first capacitor is the first voltage, and the first terminal of the first capacitor is the second voltage.

4. The fingerprint sensor according to claim 1, wherein the second drive circuit comprises a second buffer, a second inverter and a second capacitor, wherein an input terminal of the second inverter is configured to input the second input signal, and an output terminal of the second inverter is configured to output a second inverting input signal;

a first terminal of the second buffer is configured to input the first voltage, a second terminal of the second buffer is connected to a fourth terminal of the second buffer, a third terminal of the second buffer is configured to input the second inverting input signal, and the fourth terminal of the second buffer is configured to output the column select signal; and a first terminal of the second capacitor is connected to the fourth terminal of the second buffer, and a second terminal of the second capacitor is connected to the output terminal of the second inverter.

5. The fingerprint sensor according to claim 4, wherein when the second input signal is at a high level, the second inverting input signal is at a low level, the column select signal is the first voltage, the first terminal of the second capacitor is the first voltage, and the second terminal of the second capacitor is at a low level; and when the second input signal is at a low level, the second inverting input signal is at a high level, the second terminal of the second capacitor is the first voltage, and the first terminal of the second capacitor is the second voltage.

6. The fingerprint sensor according to claim 1, wherein each of the voltage integrators comprises a first switch circuit, a second switch circuit and an integration circuit, wherein the first switch circuit is configured to receive the driving signal and the column select signal and output a first output signal, the driving signal and the column select signal are used for controlling turnon and turnoff of the first switch circuit, and an output terminal of the first switch circuit is connected to the fingerprint capacitor; and the second switch circuit is configured to receive the first output signal and the first input signal, and the first output signal and the first input signal are used for controlling turnon and turnoff of the second switch circuit, wherein when the driving signal is the second voltage and the column select signal is the first voltage, the first switch circuit is turned on, the second switch circuit is turned off, and the first drive circuit charges the fingerprint capacitor with the second voltage; and when the column select signal is the second voltage, the first output signal is the second voltage and the first input signal is at a high level, the first switch circuit is turned off, the second switch circuit is turned on, and the integration circuit integrates the fingerprint capacitor.

7. The fingerprint sensor according to claim 6, wherein the first switch circuit comprises a first switch device and a second switch device, wherein a first terminal of the first switch device is configured to input the driving signal, a second terminal of the first switch device is configured to input the column select signal, and a third terminal of the first switch device is connected to a first terminal of the second switch device; and a second terminal of the second switch device is configured to input the first voltage, and a third terminal of the second switch device is configured to output the first output signal.

8. The fingerprint sensor according to claim 7, wherein the first switch circuit further comprises a third buffer, a first terminal of the third buffer is configured to input the first voltage, a second terminal of the third buffer is configured to input the driving signal, a third terminal of the third buffer is configured to input the second input signal, and a fourth terminal of the third buffer is connected to the third terminal of the first switch device.

9. The fingerprint sensor according to claim 8, wherein when the column select signal is the second voltage, the first switch device is turned off, the second switch device is turned off, and the first output signal is the first voltage; and when the driving signal is the second voltage, and the column select signal is the first voltage, the first switch device is turned on, the second switch device is turned on, the first output signal is the second voltage, and the first drive circuit charges the fingerprint capacitor with the second voltage.

10. The fingerprint sensor according to claim 6, wherein the second switch circuit comprises a third switch device and a third inverter, wherein a first terminal of the third switch device is configured to input the first output signal, a second terminal of the third switch device is configured to input the first voltage, and a third terminal of the third switch device is connected to a fourth terminal of the third inverter; and a first terminal of the third inverter is configured to input the first input signal, a second terminal of the third inverter is configured to input the first voltage, and a third terminal of the third inverter is connected to a first input terminal of the integration circuit.

11. The fingerprint sensor according to claim 10, wherein when the first input signal is at a low level, an output of the four terminal of the third inverter is the first voltage, and the third switch device is turned off; and when the first input signal is at a high level, an output of the four terminal of the third inverter is a low level, the third switch device is turned on, the first output signal is input to the first input terminal of the integration circuit, and the integration circuit integrates the fingerprint capacitor.

12. The fingerprint sensor according to claim 6, wherein each column of voltage integrators further comprises a third switch circuit, and the third switch circuit comprises a fourth buffer and a fourth switch device, wherein a first terminal of the fourth buffer is configured to input the first voltage, a second terminal of the fourth buffer is configured to input the driving signal, a third terminal of the fourth buffer is configured to input an inverting signal of the first input signal, and a fourth terminal of the fourth buffer is connected to a third terminal of the fourth switch device; and a first terminal of the fourth switch device is configured to input the driving signal, a second terminal of the fourth switch device is configured to input the column select signal, and the third terminal of the fourth switch device is connected to the first switch circuit.

13. The fingerprint sensor according to claim 12, wherein when the column select signal is the second voltage, the fourth switch device is turned off, and when the first input signal is at a low level, the fourth terminal of the fourth buffer is the first voltage; and when the driving signal is the second voltage, and the column select signal is the first voltage, the fourth switch device is turned on, and the fourth terminal of the fourth buffer is the second voltage.

14. The fingerprint sensor according to claim 1, wherein the low level is zero, and the high level is the first voltage.

15. The fingerprint sensor according to claim 1, wherein the second voltage is twice the first voltage.

16. The fingerprint sensor according to claim 1, wherein when the second input signal is a periodically varying signal, a column of voltage integrators corresponding to the second drive circuit are enabled; and the period of the second input signal is the predetermined period, in the first time period of the predetermined period, the second input signal is at a low level, and in other time period of the predetermined period, the second input signal is at a high level.

17. A terminal device, comprising a fingerprint sensor, the fingerprint sensor comprising a first drive circuit, a plurality of second drive circuits, and multiple columns of voltage integrators;

wherein the first drive circuit is configured to generate a periodic driving signal according to a periodic first input signal, and periods of the first input signal and the driving signal are both a predetermined period, the first input signal is at a high level and the driving signal is a first voltage in a first time period of the predetermined period; the first input signal is at a low level and the driving signal is a second voltage in other time period of the predetermined period; both the first voltage and the second voltage are greater than zero, and the first voltage is smaller than the second voltage;

each second drive circuit corresponds to a column of voltage integrators respectively, the each second drive circuit is configured to generate a column select signal according to a second input signal, and the column select signal is used for controlling an operating state of a corresponding column of voltage integrators, wherein when the second input signal is at a low level, the column select signal is the second voltage; and when the second input signal is at a high level, the column select signal is the first voltage; and each voltage integrator of the multiple columns of voltage integrators is configured to receive the driving signal and the column select signal generated by a corresponding second drive circuit, and charge or integrate a fingerprint capacitor according to the driving signal and the column select signal.

* * * * *